Dec. 19, 1967 R. S. JOSEPH 3,359,374

CABINET FOR PORTABLE TELEVISION RECEIVER

Filed July 1, 1965 3 Sheets-Sheet 1

INVENTOR:
RAYMOND S. JOSEPH,

BY William S. Wolfe
HIS ATTORNEY.

CABINET FOR PORTABLE TELEVISION RECEIVER

Filed July 1, 1965 3 Sheets-Sheet 2

INVENTOR:
RAYMOND S. JOSEPH,

BY William S. Wolfe
HIS ATTORNEY.

CABINET FOR PORTABLE TELEVISION RECEIVER

Filed July 1, 1965 3 Sheets-Sheet 3

INVENTOR:
RAYMOND S. JOSEPH,
BY William S. Wolfe
HIS ATTORNEY.

United States Patent Office 3,359,374
Patented Dec. 19, 1967

3,359,374

CABINET FOR PORTABLE TELEVISION RECEIVER

Raymond S. Joseph, Syracuse, N.Y., assignor to General Electric Company, a corporation of New York Filed July 1, 1965, Ser. No. 468,833
9 Claims. (Cl. 174—52)

ABSTRACT OF THE DISCLOSURE

In a television receiver cabinet, a front assembly for mounting electronic components includes a circuit board mounted parallel and interior to a bottom portion having a hole therein and overlying said circuit board for ease in servicing in the unassembled position. A rear assembly includes a hinged closure member for isolating the underside of the circuit board in the assembled position. In assembling the cabinet, the closure member is inserted into tracks mounted beneath the circuit board but interior to the base portion.

Figures 1, 4:
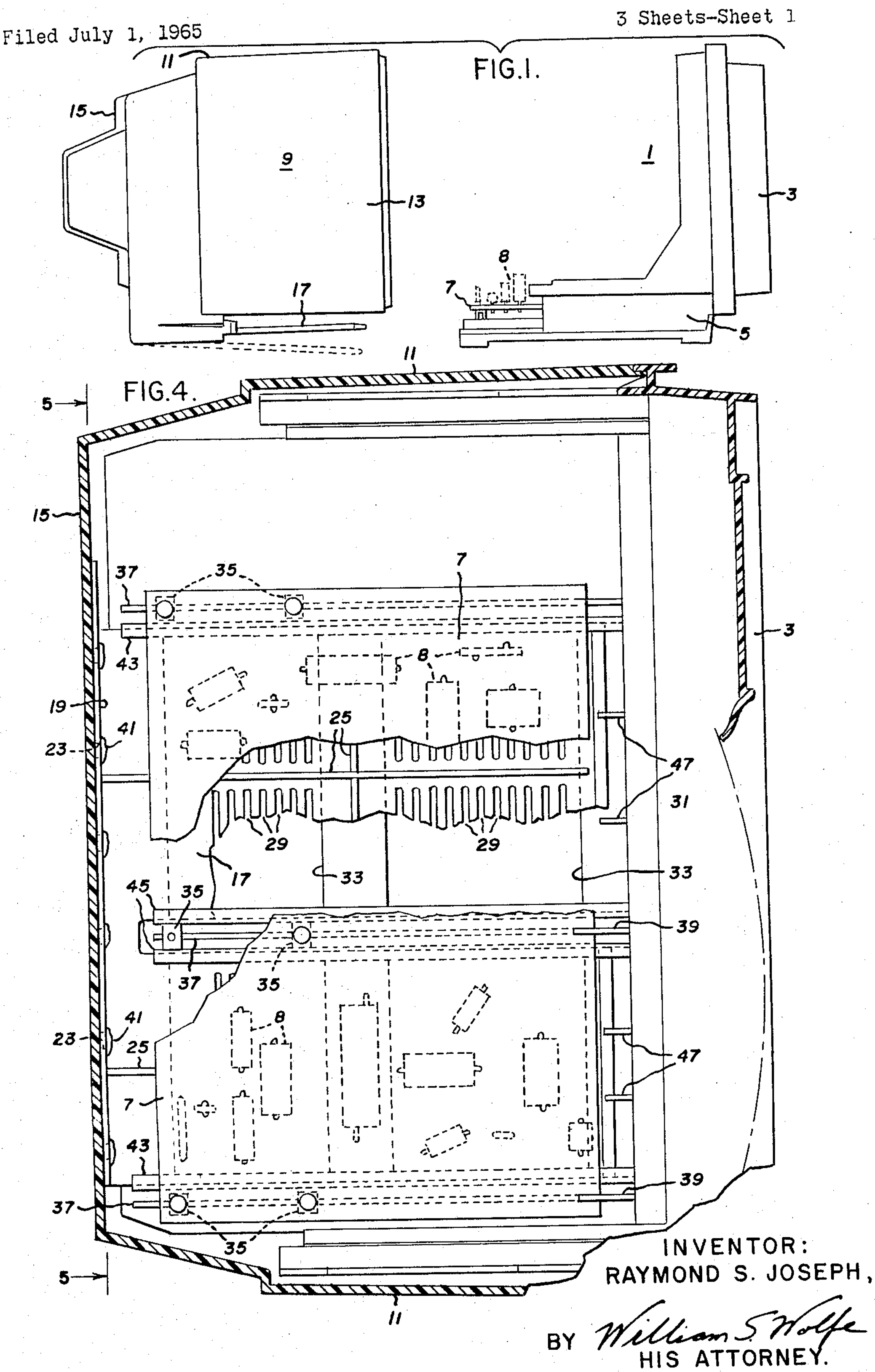

The present invention is directed toward television receivers and more specifically toward an improved cabinet for a portable television receiver.

Due to considerations of size and cost, it is often desirable to employ a circuit board for mounting the various electronic components of a television receiver to thereby obviate the expensive and bulky chassis conventionally utilized for this purpose. However, since such a circuit board does not itself exhibit the structural rigidity associated with a conventional chassis, it is necessary to rigidly mount the circuit board to the receiver cabinet. The circuit board mounted to the cabinet in this manner should be freely accessible for servicing without the necessity of removing the board from the cabinet, disassembly of the board from the cabinet at best being difficult and possibly resulting in damage to the board. Further, due to safety considerations the circuit board although freely accessible for servicing must not be accessible during operation. These somewhat conflicting desiderata have not been adequately satisfied by the prior art.

Accordingly, an object of the invention is to provide an improved cabinet for a television receiver.

Another object is to provide an improved cabinet for a television receiver employing a circuit board for mounting electronic components.

Another object is to provide an improved cabinet for a television receiver of the type employing a circuit board, the cabinet insuring easy servicing of the circuit board while still retaining the requisite safety features.

These and other objects are achieved in one embodiment of the invention through the use of a circuit board bearing the various electronic components and mounted generally parallel to the bottom of the cabinet in proximity thereto. The bottom of the cabinet front assembly is provided with an access hole beneath the circuit board thereby providing access to the underside of the board without the necessity of removing the board from the cabinet. The cabinet further is provided with a closure panel for the access hole, the closure panel being hinged to the rear portion of the cabinet near the bottom thereof. The closure panel is adapted to be received by suitable track means in the interior of the cabinet front assembly so that when the rear assembly and front assembly are mated the panel is received by the track means and overlies the access hole below the circuit board. The hinging of the closure panel to the rear portion provides the flexibility necessary to insure that the closure panel will be easily received by the track means. The relationship of the closure panel and the track means is such that proper mating of the rear and front assemblies without inserting the closure panel in the track means is impossible. Thus, the interlock associated with the front and rear assemblies will not be closed if the closure panel is improperly inserted so that energization of the set while the bottom of the circuit board remains accessible is impossible.

Figure 2:
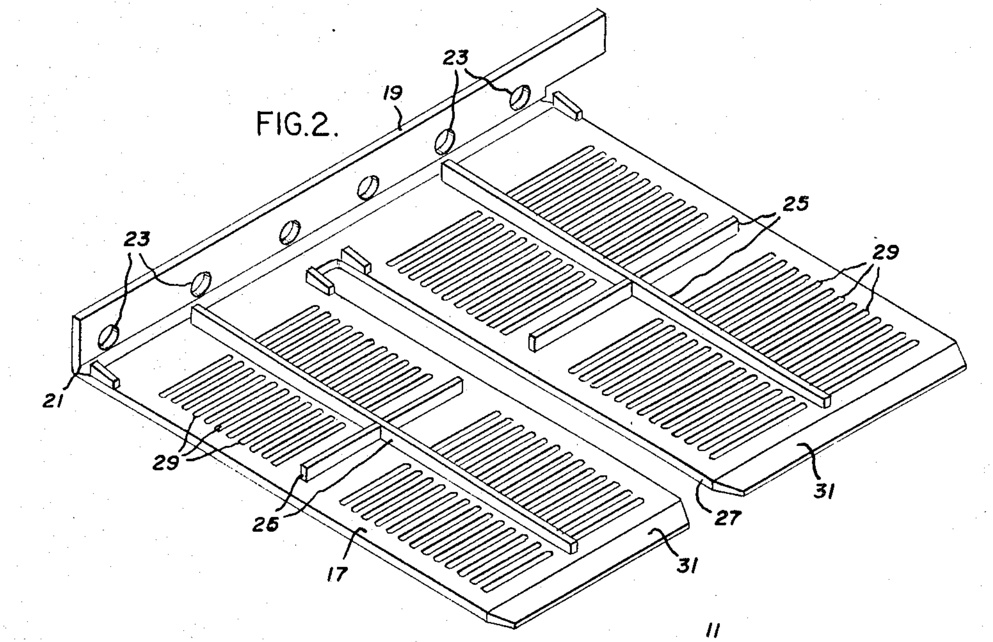
Figure 3:
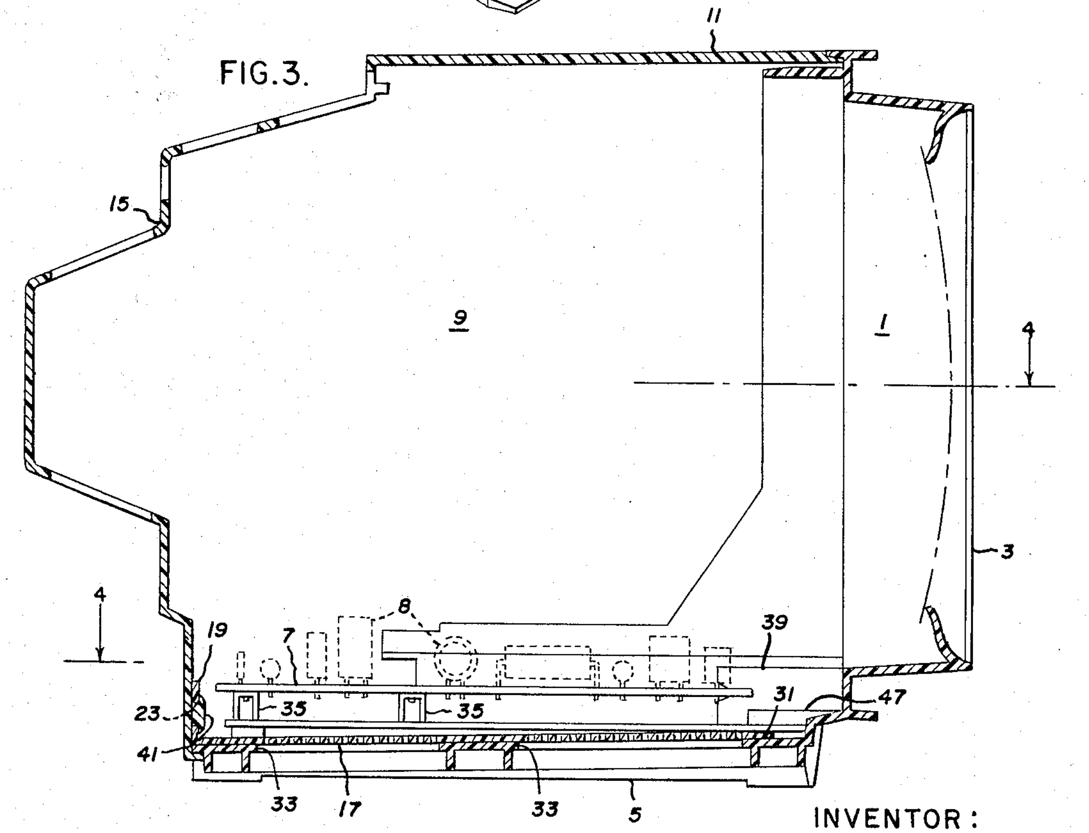
Figure 5:
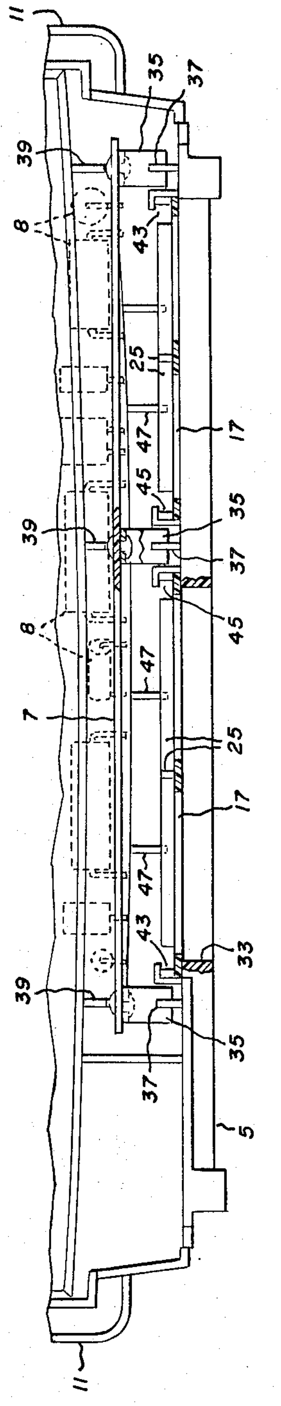

The novel and distinctive features of the invention are set forth in the appended claims. The invention itself together with further objects and advantages thereof, may best be understood by reference to the accompanying drawings in which:

FIGURE 1 is an exploded side view of a television receiver cabinet in accordance with the invention, FIGURE 2 is a perspective view of the closure member as employed in the cabinet of FIGURE 1, FIGURE 3 is a side sectional view of the assembled cabinet of FIGURE 1, FIGURE 4 is a sectional view taken along the line 4—4 of FIGURE 3, and FIGURE 5 is a sectional view taken along the line 5—5 of FIGURE 4.

Referring to FIGURE 1 there is shown a cabinet for a portable television receiver in accordance with the invention. The cabinet comprises a front assembly generally shown at 1 including front and bottom portions 3 and 5 respectively. The front and rear assemblies are preferably fabricated by injection molding of a high heat, high impact polystyrene material. A circuit board 7 including electronic components generally shown at 8 and having wiring (not shown) printed or etched thereon in conventional fashion, is positioned generally parallel and in proximity to the bottom portion 5. In accordance with the invention, the bottom portion 5 of the cabinet is provided with an access hole as more clearly shown in FIGURES 3 and 4. In this manner the under surface of the circuit board 7 is readily accessible for servicing without the necessity of removing the circuit board from the cabinet.

The cabinet further includes a rear assembly generally shown at 9 including a top portion 11, a pair of side wall portions 13 and a rear portion 15. The rear assembly 9 further includes a closure panel 17 hinged to the rear portion 15 near the bottom thereof. The closure panel 17 is pivotable as indicated in dotted lines and is adapted to be received by the front assembly 1 to overlie the access hole in the bottom portion 5 when the rear assembly 9 is mated to the front assembly 1.

Referring now to FIGURE 2 there is shown a detailed perspective view of the closure panel 17 as employed in the cabinet of FIGURE 1. The closure panel 17 includes a mounting member 19 connected to the closure panel 17 by a hinge portion 21. The closure panel 17 and the mounting portion 19 are most advantageously molded from a polypropylene material the hinge portion 21 being formed by a reduced thickness portion of the material.

Apertures 23 are provided in the mounting portion 19 for assembling the closure panel to the rear assembly 9. The closure panel 17 is provided with a plurality of strengthening ribs 25 and includes a slot 27 which in conjunction with the side edges of the closure panel is adapted to engage suitable slot means in the front assembly 1. Closure panel 17 is further provided with a plurality of elongated apertures 29 for cooling purposes and the leading edge of the panel is provided with a taper 31 which cooperates with the front assembly 1 to provide precise and vibration-free positioning of the closure panel 17.

Referring to FIGURES 3, 4 and 5, there is shown more clearly the manner in which the rear assembly 9 is mated to the front assembly 1 with the closure panel 17 received by suitable track means and overlying the access hole 33 in the bottom portion 5 of the front assembly 1.

The circuit board 8 is mounted through the use of a plurality of mounting clips, the mounting clips 35 being affixed to suitable ribs 37 and are provided with holes at the top thereof to receive mounting screws passing through the circuit board 7. In this manner the circuit board 7 is mounted generally parallel to the bottom portion 5 of the front assembly 1 and in spaced relationship thereto. The leading edge of the circuit board 7 is received by a plurality of notched mounting members 39 as shown most clearly in FIGURE 3.

The closure panel 17 is mounted to the rear portion 15 of the rear assembly 9 as shown most clearly in FIGURE 3. The mounting of the closure panel to the rear portion is most easily achieved by heat staking the mounting portion of the closure panel 17 to the rear portion 15 through the use of pins 41 extending through the apertures 23. The pins are heat deformed to achieve a rigid assembly. Thus, the closure panel 17 is pivotally mounted to the rear portion 15 by the action of the hinged portion 21.

The bottom portion 5 of the front assembly 1 is provided with a pair of track members 43 adapted to receive the edges of the closure panel 17 as most clearly shown in FIGURE 5. A pair of similar track members 45 are provided for engaging the slot portion 27 of the closure panel 17 is order to add additional rigidity and strength to the assembly. The track members 43 and 45 are tapered in a direction from the rear to the front of the cabinet to assist in guiding the closure panel 17 to the desired position substantially coextensive with the circuit board. A plurality of positioning members 47 are positioned near the front of the cabinet to receive the leading edge of the closure panel 17, the positioning members 47 being slotted as shown to conform to the taper 31 of the closure panel 17. In this manner exact positioning of the closure panel is assured.

It will be appreciated that through use of the closure panel of the invention ease of access for servicing is provided while still maintaining the requisite safety features. Thus, if when assembling the rear assembly 9 to the front assembly 1, the closure panel 17 is properly inserted in the associated track members 43 and 45, registration is achieved between the front and rear assemblies so that proper mating takes place and the conventional interlock (not shown) is closed. During this operation the flexibility afforded by the hinge portion 21 insures that the closure panel 17 is easily inserted in the proper position. However, if the closure panel 17 is not properly inserted in the track means, as for example where an attempt is made to position the closure panel above or below the track members 43 and 45, proper mating of the front assembly 1 and rear assembly 9 cannot take place and the interlock will remain open. Thus, the receiver remains unenergized and safety requirements are satisfied.

Although the invention has been described with respect to certain specific embodiments it will be appreciated that modification and changes may be made by those skilled in the art without departing from the true spirit and scope of the invention.

What is claimed and desired to be secured by Letters Patent of the United States is;

1. A television receiver cabinet having an electronic component bearing circuit board positioned therein, said cabinet comprising;

(a) a first assembly having the circuit board assembled thereto and a bottom portion having a hole therein for providing access to one surface of the circuit board interior thereto, (b) a second assembly adapted to mate with said first assembly and having a closure panel connected thereto, (c) said closure panel overlying and interior to the hole in said bottom portion of said first assembly and substantially coextensive with said circuit board when said first and second assemblies are mated.

2. A television receiver cabinet having an electronic component bearing circuit board positioned therein, said cabinet comprising;

(a) a first assembly including a bottom portion having the circuit board assembled generally parallel thereto and having a hole therein for providing access to the surface of the circuit board adjacent said bottom portion, (b) track means affixed to said bottom portion, (c) a second assembly adapted to mate with said first assembly and including a rear portion having a closure panel pivotally connected thereto, (d) said closure panel being received by said track means and overlying the hole in said bottom portion when said first and second assemblies are mated.

3. The cabinet defined in claim 2 wherein said track means includes first and second channel members adapted to engage the edges of said closure panel.

4. The cabinet defined in claim 3 wherein said closure panel is provided with an intermediate slot and said track means further includes third and fourth channel members for engaging the portions of said closure panel on each side of the slot.

5. The cabinet defined in claim 3 wherein the edge of said closure panel most removed from said rear portion is tapered and means are provided on said first assembly for receiving said tapered edge in an interference fit.

6. The cabinet defined in claim 2 wherein said closure panel includes a main body portion and a mounting portion pivotally connected to said main body portion by an integral hinge.

7. The cabinet defined in claim 6 wherein said mounting portion of said closure panel is heat staked to said rear portion of said second assembly.

8. The cabinet defined in claim 6 wherein said closure panel comprises a plastic sheet having a reduced thickness portion intermediate said mounting portion and said main body portion to define said integral hinge.

9. The cabinet defined in claim 8 wherein said closure panel is injection molded from a polypropylene material.

References Cited

UNITED STATES PATENTS 3,105,110 9/1963 Kitamura ---------- 178—7.9

LARAMIE E. ASKIN, *Primary Examiner.*

LEWIS H. MYERS, *Examiner.*

H. W. COLLINS, *Assistant Examiner.*